United States Patent [19]

Starzewski et al.

[11] Patent Number: 5,705,267
[45] Date of Patent: Jan. 6, 1998

[54] THERMOSTABLE POLARIZERS

[75] Inventors: Karl-Heinz Aleksander Ostoja Starzewski, Vilbel; Siegfried Thurm, Meerbusch, both of Germany

[73] Assignee: Bayer Aktiengesellschaft, Leverkusen, Germany

[21] Appl. No.: 590,222

[22] Filed: Jan. 23, 1996

[30] Foreign Application Priority Data

Jan. 30, 1995 [DE] Germany ............... 195 02 806.6

[51] Int. Cl.⁶ ............... B32B 7/02; B32B 27/00; C23C 14/10; C23C 16/24
[52] U.S. Cl. ............... 428/336; 359/490; 428/446; 428/448; 428/451
[58] Field of Search ............... 428/336, 446, 428/447, 448, 451; 359/490

[56] References Cited

U.S. PATENT DOCUMENTS

| | | | |
|---|---|---|---|
| 3,914,017 | 10/1975 | Bedell et al. | 359/490 |
| 4,818,624 | 4/1989 | Downey, Jr. | 428/447 |
| 5,049,427 | 9/1991 | Starzewski et al. | 428/40.4 |

OTHER PUBLICATIONS

Database WPI, AN 86–180933, abstract of JP 61–116332, Jun. 1986.
Japanese patent, 61–116332, Jun. 1986.
Database WPI, AN 94–223024, abstract of JP 06–160630 (Jun. 1994).
Japanese patent, JP 06–160630, Jun. 1994.
Database WPI, AN 95–001799, abstract of JP 06–289227, Oct. 1994.
Japanese patent, JP 06–289227, Oct. 1994.

*Primary Examiner*—D. S. Nakarani
*Attorney, Agent, or Firm*—Sprung Kramer Schaefer & Briscoe

[57] ABSTRACT

Thermostable, flexible polarizers having a polarizing layer of a polymer with conjugated double bondings are obtained when their surfaces are sealed by a protective layer of $SiO_x$ where x is from 1 to 2.

16 Claims, No Drawings

THERMOSTABLE POLARIZERS

BACKGROUND OF THE INVENTION

The invention relates to thermostable, flexible polarizers which contain a polarizing layer of a polymer with conjugated double bondings and with an $SiO_x$-sealed surface. The invention furthermore relates to polarizers of this type which are additionally bonded to outer layers.

U.S. Pat. No. 4,818,624 describes the stabilization of light polarizers by surface silylation using an organosilane. The action is inadequate, since bleaching and colour shifts are observed after 24 hours at only from 49° to 74° C. (120° to 165° F.).

The production of laminates from various substrates with adhesion interlayers is known. U.S. Pat. No. 5,049,427 describes laminated polarizers which contain a polarizing core layer of a polyacetylene (PAC)-containing polymer (POLPAC) and transparent outer layers, where the layers are bonded by means of a special polyurethane-polyurea.

Although POLPAC polarizers already have excellent properties, the stability is still inadequate under extreme conditions. After storage at 90° C. for 500 hours, the transmission of the polarizer for unpolarized light has changed, the change in transmission $\Delta T_{unpol}$ being more than 5%.

Use in optical displays which are exposed to particularly high temperatures (for example dashboards in automobiles) is only possible, however, if the decrease in the optical properties $\Delta T_{unpol}$ and $\Delta P$ of the polarizer under these conditions is at most 5%, where $\Delta P$ is the change in degree of polarization. It has been reported that the optical properties of e.g. POLPAC polarizers are constant at 100° C. for 1,000 hours after bonding between glass plates. However, such laminate systems are not very suitable for the production of displays. Flexible polarizers are preferred, both with respect to the processing properties and in the context of flexible plastic displays.

SUMMARY OF THE INVENTION

The object of the invention was therefore to produce polarizers based on a polymer with conjugated double bondings which satisfy the abovementioned conditions.

Surprisingly, it has now been found that this object can be achieved if the polarizer is sealed on its surface by an $SiO_x$ layer.

DETAILED DESCRIPTION OF THE INVENTION

The sealing of the invention is carried out by physical vapour deposition (PVD), by plasma chemical vapour deposition (plasma CVD) or by sputtering. These processes and variants thereof are known to the person skilled in the art. Preferably the process of PVD is employed.

In the case of sealing by PVD, commercial SiO is evaporated in the absence or presence of various amounts of $O_2$ and deposited on the polarizer to be sealed. In the absence of $O_2$ a SiO protective layer is obtained, in presence of $O_2$, the oxygen content of the protective layer increases until finally, in the presence of an excess of $O_2$, a layer of $SiO_2$ is deposited. $SiO_x$ having any desired values from 1 to 2 for x denotes this region. For the purposes of stabilization of the polarizer to oxygen, values of from 1.1 to 1.9, in particular from 1.4 to 1.8, are preferred. However, values of up to x=2 are useful for achieving mechanical properties (for example scratch resistance).

Analogously, the sealing can be achieved with the aid of plasma CVD, in which case $SiO_x$ protective layers on the polarizer to be sealed are obtained by a chemical reaction, for example of a silane with an $O_2$ source, such as N2O or another nitrogen oxide, and deposition.

In one variant, the protective layer can be built up successively first from relatively oxygen-depleted $SiO_x$ where x= 1.1 to 1.8 and then from relatively oxygen-rich $SiO_x$ where x=1.4 to 2.

The $SiO_x$ protective layer has a thickness of from 10 nm to 10 µm, preferably of from 100 nm to 1 µm. For further stabilization, cut edges can also be sealed in the described manner.

The invention furthermore relates to a laminated flexible polarizer comprising a polarizing core layer of a polymer with conjugated double bondings and transparent, flexible outer layers applied to both sides, characterized in that the core layer sealed by means of an $SiO_x$ protective layer and the outer layers are bonded by means of a silicate layer or by means of an organic adhesive, and the polarizer laminated in this way is flexible. The polarizer can, by means of the silicate layer, also be used for bonding to glass plates, optical lenses or prisms. If the polarizer is bonded on one side to a glass display or another glass element with the aid of a silicate layer or by means of an organic adhesive, it is sufficient to protect its free surface by means of an $SiO_x$ layer.

Silicate layers of this type are preferably applied to the core layer sealed by means of an $SiO_x$ protective layer and/or to the outer layers in the form of an aqueous solution. Suitable aqueous solutions of silicates are known aqueous solutions of sodium water glass and potassium water glass. Conventional types of water glass have, in the case of sodium water glass, solids contents of from 25 to 60% by weight and $SiO_2$ contents of from 20 to 40% by weight; the remainder of the solids content is $Na_2O$; and in the case of potassium water glass, they have solids contents of from 25 to 40% by weight and $SiO_2$ contents of from 20 to 30% by weight; the remainder of the solids content is $K_2O$. In order to obtain relatively thin silicate layers, these solutions can also be diluted with water. The $SiO_2$ contents are preferably as high as possible, i.e. with an $SiO_2/Na_2O$ weight ratio of $\geq 3$ or an $SiO_2/K_2O$ weight ratio of $\geq 2.2$. Use of silicate layers renders organic adhesives, as described in large number in U.S. Pat. No. 5,049,427, superfluous.

The silicate layers stabilize the properties of the polarizer in addition to the $SiO_x$ layer in a layer thickness of only $\leq 2$ µm. Preferably, from 100 mg to 2 g of water glass (solids) /m² of surface to be bonded are required to achieve thermostable bonding of the laminate. In a preferred embodiment, the $SiO_x$-sealed core layer and/or outer layer is/are subjected, before coating with the silicate solution, to treatment with a silane or with a borate. This measure improves, in particular, the bond strength.

Suitable silanes conform to the formula:

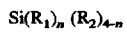

in which $R_1$, independently of one another, are halogen or alkoxy,
$R_2$, independently of one another, are alkyl or alkenyl, and
n is the number 2, 3 or 4

Alkyl and alkoxy radicals $R_1$ and $R_2$ can be substituted.

Examples of suitable silanes are tetramethoxysilane, tetraethoxysilane, methyltrimethoxysilane, dimethyldimethoxysilane, ethyltriethoxysilane, dimethyldichlorosilane, vinylmethyldichlorosilane and vinyltriethoxysilane. Silanes can also be mixed directly, for example emulsified, into the silicate solution.

Examples of suitable borates are boric acid and borax. Boric acid and borates can also be mixed directly into the water glass solution or dissolved therein.

The silanes and borates are applied, in particular, by dipping the $SiO_x$-sealed core layer and/or the outer layer into a solution of the compound or, if the compound is liquid, into the pure compound and removing it again. The amount taken up is so small that it cannot be reliably measured by weighing, but is usually less than 1 g/m².

Outer layers have, for example, thicknesses of from 5 μm to 1 mm, preferably from 20 to 200 μm. The polarizing core layer has, for example, a thickness of from 1 to 200 μm, preferably from 5 to 50 μm.

Examples of suitable outer layers are aromatic polyesters, polyacrylonitriles, poly(meth)acrylates, polysulfones, aromatic polycarbonates, cellulose acetates, cellulose acetobutyrates, polyamides, polyhydantoins, polyimides, polyamideimides, polyparaphenylenebenzobisimidazoles and -oxazoles and polyether ketones, preference being given to polyesters, poly(meth)acrylates, polycarbonates and cellulose esters. The transparency of these materials is their most important feature. They are generally employed in the form of films.

The polarizing core layer for the inventive polarizer sealed on its surfaces with $SiO_x$, is a polymer with conjugated double bondings. Such polymers are known. Thus, e.g. U.S. Pat. No. 3,914,017 describes the partial dehydration of polyvinyl alcohol whereby result domains of conjugated double bondings in the polymer main chain. The thereby resulting domains of conjugated double bondings are in general rather short (average: 2–15C=C). The dehydration can be carried out purely thermally or with acid catalysis. The polyvinyl alcohol to be dehydrated further can be grafted with other vinyl monomers, e.g. with (meth) acrylates, acrylonitrile, styrene, vinyl acetate or vinyl chloride. In an analogous manner conjugated double bondings can be formed by splitting off HCl from polyvinyl chloride or by splitting off acetic acid from polyvinyl acetate. Finally, the above mentioned PAC-containing polymer can be formed by polymerization of acetylene in a polymer other than PAC being in solution. All these polymers can be employed according to the invention.

Preferably, the polarizing core layer is of a partially dehydrated polyvinyl alcohol or of PAC.

The polarizing core layer is especially preferably a polarizer made from PAC-containing polymer products whose matrix is a polymer containing polar groups and which have a maximum degree of polarization P of at least 90%, preferably at least 95%, particularly preferably at least 98%, and a maximum dichroic ratio $Q_E$ of 5 or more preferably of 10 or more, in both cases based on the region of visible light. These polarizers are employed in the form of films having a preferential direction produced by stretching. The degree of stretching ε is greater than 200%, preferably at least 400%, particularly preferably from 500% to 1,000%.

Especially preferred polarizing core layers consist of PAC-containing polymer products the matrix of which is a partially dehydrated polyvinyl alcohol, and the polarizing effect of which ranges from the non-visible close ultra-violett wave length area (<450 nm) via the visible wave length area (450 –700 nm) to the close infra-red area (700–850 nm). Such partially dehydrated POLPAC-polarizers can be prepared a) in that the used polyvinyl alcohol, prior to the acetylene polymerization, is tempered at 150°–250 ° C. until the wanted dehydration is reached which is recognized by the decoloration, thereafter acetylene is polymerized in a solution of this treated polyvinyl alcohol, a film is produced therefrom and stretched; or b) in that a POLPAC film whose matrix is polyvinyl alcohol is stretched and thereafter tempered which tempering may be carried out in the presence of air or with the exclusion of air to maintain the long-wave polarization effect. The film may also, prior to or after the stretching, be pretreated with an acid, e.g. with HCl gas in order to accelerate the dehydration process. It is likewise possible to add to the polymer, prior to the film production, a small amount of acid, e.g. hydrochloric acid, phosphoric acid, sulphonic acid or sulphonic acid-containing substances.

The degree of polarization P for linear-polarized light and the degree of stretching ε are defined as follows:

$$P = \frac{\text{transmission in the pass position minus transmission in the block position}}{\text{transmission in the pass position plus transmission in the block position}} \times 100$$

$$\epsilon = \frac{l - l_o}{l_o} \cdot 100$$

($l$ = length after stretching; $l_o$ = length before stretching)

The production of PAC-containing polymer products is disclosed, for example, in U.S. Pat. No. 5,049,427, where acetylene is polymerized in a polymer solution in the presence of a suitable catalyst, e.g. in the presence of Ni(O)-complexes in a solution of a polymer other than PAC.

The polymer other than PAC is present in an amount of from 1 to 99.9% by weight, preferably from 50 to 99.9% by weight, based on the total polarizer.

Examples of suitable polymers other than PAC are polyvinyl chloride, polyvinylbutyral, polyvinyl alcohol (PVA), partially hydrolysed polyvinyl acetate (PVAC) and other vinyl alcohol-containing (co)polymers, polyacrylonitrile, acrylonitrile-containing copolymers, polyvinylpyrrolidone, methylcellulose and other cellulose derivatives, and polycarbonate. Preference is given to solutions of PVA and partially hydrolysed PVAC.

Examples of solvents for the polymers other than PAC include N-methylpyrrolidone (NMP), dimethylformamide (DMF) and dimethyl sulphoxide (DMSO). The concentration of the polymer in the solvent is from 1 to 20% by weight, preferably from 2 to 20% by weight.

The novel laminated polarizers are distinguished by a number of outstanding properties:

1. high light transmission
2. high light fastness
3. thermostability of the polarizing core layer
4. excellent mechanical properties.

The novel polarizers are suitable for all areas of use in which polarization films are used, in particular in optics (for example polarizing microscopes, photography and antireflection coating of sunglasses and ski goggles) and for LC-displays, for example in watches, pocket calculators, laptops, computers, projection displays, videogames, camcorders and flat-screen TV sets.

At 80° C., even unlaminated POLPAC films without stabilizers have good stability, the change in transmission (ΔT) after 500 hours at 80° C. in air being 2–3% and the change in degree of polarization (ΔP) being less than 1%.

The novel polarizer may, in addition to the conjugated double bondings, e.g. in addition to the polyacetylene, contain additional, dichroic substances, for example iodine or dichroic dyes. However, polyacetylene makes up at least 50% by weight, preferably at least 80% by weight, of the total amount of dichroic substances.

EXAMPLES

Example 1

A POLPAC film with a thickness of 11 μm which has been stretched by 700% had a transmission T of 38.7% at 600 nm and a degree of polarization P of 99.99%. After 500 hours at 80° C., the transmission had risen to 41.7% and the degree of polarization had only dropped to 99.89%.

Example 2

The same film as in Example 1 was kept at 90° C., during which the transmission at 600 nm rose by 5.1% points even after 270 hours and the degree of polarization dropped by 1.84% points.

Example 3

A sample piece of a film similar to that of Example 1, but stretched by 600% and measuring 60 mm ×60 mm, was attached to a rotatable substrate holder in an A 1100 vapour-deposition unit from Leybold-Heraeus, Hanau, BRD. The process chamber of the vapour-deposition unit was then closed and evacuated to approx. $10^{-3}$ Pa. $O_2$ was then admitted to a pressure of 7 Pa, and the rotary drive of the substrate holder was switched on so that the latter rotated at 20 rpm. By application of a voltage of −480 V against earth to an Al plate connected as cathode, a low-pressure plasma was ignited. The samples were treated in this plasma for two minutes at a power of 5.6 watts. The voltage was then switched off, the addition of $O_2$ was terminated, and the process chamber was evacuated to $10^{-4}$ Pa.

When this pressure had been reached, $O_2$ was again admitted into the process chamber until a pressure of $10^{-2}$ Pa was obtained. After this pressure had been reached, the electron-beam gun was switched on and the SiO to be evaporated (tradename Patinal, Merck, Darmstadt), which was in a water-cooled Cu crucible, was heated to approx. 1950 K within four minutes using a power of 400 W. A movable diaphragm between the electron-beam gun and the substrate holder was subsequently removed, and the film pieces were coated at a rate of 0.5 nm/sec for 400 seconds. The diaphragm was then replaced between the electron-beam gun and the substrate holder, the $O_2$ addition was switched off and the coating process was terminated. After the electron-beam gun had been switched off and the evaporation material had been cooled, the vacuum in the process chamber was released, and the film coated on one side was removed, turned, and vapour deposition-coated on the uncoated side as described above.

The film coated with $SiO_x$ on both sides in a thickness of 200 nm per side was subjected, without lamination, to a 90° C. heat test, during which the transmission rose by only 2.1% (from 33.3% to 35.4%) in 480 hours. The degree of polarization dropped by only 0.5% (from 99.8% to 99.3%), both measured at 600 nm.

Example 4

Example 3 was repeated with a film of dehydrated and grafted polyvinyl alcohol stretched by 600%. The polymer for this film was obtained by grafting of polyvinyl alcohol with ethyl acrylate and methyl methacrylate and successive splitting off $H_2O$ with the aid of water-free hydrogen chloride. The $SiO_x$-coating was 180 nm on each side. During the heat test the transmission changed by less than 2% and the degree of polarization by less than 1%, both measured at 600 nm.

Example 5

A 23 μm thick film of polyvinyl alcohol (prepared by saponification of polyvinyl acetate; degree of saponification: 99%) was exposed to an atmosphere of HCl gas at room temperature for 5 min, thereafter stretched monoaxially to the sevenfold length at 200° C. and kept for further 15 min under stretch tension at 200° C. Then the film was 12 μm thick. Measuring with polarized light yielded a transmission of 43.9% and a degree of polarization of 93.9%. The film was coated with $SiO_x$ (x=1.7) in the manner of Example 3. A repeated measuring after the heat test at 90° C. resulted in a change of a transmission of less than 2% and of the degree of polarization by 0.9%.

Example 6

A POLPAC film was treated with gaseous HCl and stretched under argon by 700%, i.e., to the eightfold of its original length and thereafter tempered in the presence of air at 200° C. for 15 min. The transmission at 600 nm was 38.5%, the degree of polarization was 99.99%. The polarizing effect at 400 nm rose from 81% to 96% due to tempering. The polarizing effect at 700 nm fell only from 99.8% to 98.1%. After coating with $SiO_x$ and a heat test at 90° C. for 20 days the changes were: <2% for the transmission and <1% for the polarization. When the tempering was carried out under argon no polarizing change at 700 nm was observed.

What is claimed is:

1. A thermostable, flexible polarizer having a polarizing layer of a polymer with conjugated double bonds the surface of which is sealed with a layer of $SiO_x$ where x has any desired value from 1 to 2.

2. The polarizer of claim 1, wherein x has a value from 1.1 to 1.9.

3. The polarizer of claim 2, wherein x has a value from 1.4 to 1.8

4. The polarizer of claim 1, wherein the sealing of the surface with $SiO_x$ is produced by physical vapour deposition (PVD), by plasma chemical vapour deposition (plasma CVD) or by sputtering.

5. The polarizer of claim 4, wherein the sealing of the surface with $SiO_x$ is produced by PVD.

6. The polarizer of claim 1, wherein the $SiO_x$ protective layer has a thickness of from 10 nm to 10 μm.

7. The polarizer of claim 6, wherein the $SiO_x$ layer has a thickness from 100 nm to 1 μm.

8. The polarizer of claim 1, wherein said polarizer layer has sealing layers of $SiO_x$ on both surfaces and wherein further outer layers are bonded to the $SiO_x$-sealed layers with the aid of sodium water glass, potassium water glass, or organic adhesives.

9. The polarizer of claim 8, wherein the outer layers are bonded with the aid of sodium water glass or potassium water glass.

10. The polarizer of claim 9, wherein the $SiO_x$-sealed polarizing layer or the outer layer or the $SiO_x$-sealed polarizing layer and the outer layers is/are subjected, before coating with the silicate solution, to treatment with a silane or with a borate.

11. The polarizer of claim 10, wherein the silane conforms to the formula $$Si(R_1)_n(R_2)_{4-n}$$

in which $R_1$, independently of one another, are halogen or alkoxy, $R_2$, independently of one another, are alkyl or alkenyl, and n is the number 2, 3 or 4.

12. The polarizer of claim 9, wherein said bonding is done with a solution of sodium water glass admixed with a silane or a borate or a silane and a borate.

13. The polarizer of claim 1, wherein the polymer is a partially dehydrated polyvinyl alcohol or a polyacetylene containing polyvinyl alcohol.

14. The polarizer of claim 13, wherein the polymer is a polyacetylene containing polyvinyl alcohol.

15. The polarizer of claim 13, wherein the polymer is a polyacetylene containing polyvinyl alcohol, which polyvinyl alcohol, prior to or after the acetylene polymerization, is partially dehydrated by tempering at 150°–250° C., by acid treatment, or by tempering and acid treatment.

16. The polarizer of claim 1, which contains additional dichroic substances.

* * * * *

UNITED STATES PATENT AND TRADEMARK OFFICE
CERTIFICATE OF CORRECTION

PATENT NO. : 5,705,267
DATED : January 6, 1998
INVENTOR(S) : Starzewski, et al.

It is certified that error appears in the above-indentified patent and that said Letters Patent is hereby corrected as shown below:

Col. 7, line 8    After " sodium water glass " insert -- or potassium water glass --

Signed and Sealed this

Third Day of November, 1998

*Attest:*

BRUCE LEHMAN

*Attesting Officer*    *Commissioner of Patents and Trademarks*